United States Patent [19]

Nossen et al.

[11] 4,144,579

[45] Mar. 13, 1979

[54] ARITHMETIC SYNTHESIZER FREQUENCY GENERATION WITH REDUCED PHASE JITTER

[75] Inventors: Edward J. Nossen, Cherry Hill, N.J.; Eugene R. Starner, Bethlehem, Pa.

[73] Assignee: RCA Corporation, New York, N.Y.

[21] Appl. No.: 818,715

[22] Filed: Jul. 25, 1977

[51] Int. Cl.² .................. G06J 1/00; G06F 15/34; H03K 4/02

[52] U.S. Cl. .................. 364/607; 307/227; 328/14; 328/186

[58] Field of Search .......... 364/718, 481, 487, 607, 364/608, 605; 328/14, 181, 185, 186; 307/227, 228

[56] References Cited

U.S. PATENT DOCUMENTS

| | | | |
|---|---|---|---|
| 3,654,450 | 4/1972 | Webb | 328/14 X |
| 3,676,784 | 7/1972 | Le Comte | 307/227 X |
| 3,689,914 | 8/1971 | Butler | 328/14 X |
| 3,918,046 | 11/1975 | Rivers | 307/227 X |
| 3,973,209 | 8/1976 | Nossen et al. | 328/14 |
| 4,021,757 | 5/1977 | Nossen | 325/148 |

OTHER PUBLICATIONS

Gehweiler et al.—"CMOS/SOS Developments for Signal Processing Applications"—*Ninth Annual Asilomar Conference*—Nov. 1975.

*Primary Examiner*—Joseph F. Ruggiero
*Attorney, Agent, or Firm*—H. Christoffersen; Samuel Cohen; George J. Seligsohn

[57] ABSTRACT

Arithmetic synthesizer having an output circuit that provides a linear phase output signal. A ramp generator controlled by the stepped output signal from the arithmetic synthesizer interpolates the value of the signal slope between steps to supply a phase output having low noise, i.e., reduced time jitter.

5 Claims, 4 Drawing Figures

ARITHMETIC SYNTHESIZER FREQUENCY GENERATION WITH REDUCED PHASE JITTER

This invention relates to the generation of phase controlled signals by digital arithmetic synthesizers and particularly to the accurate phase extraction of the generated signal.

An arithmetic synthesizer is an electronic apparatus which synthesizes a frequency signal by simple arithmetic addition, complementing, and sign changing of digital numbers. This apparatus is sometimes called a digital phase accumulator. Such devices usually produce high phase noise resulting from the inherent characteristics of the integer arithmetic with which they operate. They can produce spurious signals which are only 40–60 dB below the desired output signal level. Furthermore, such spurious signals are sometimes within the desired modulation bandwidth which makes a conventional arithmetic synthesizer undesirable for many modern applications. If the synthesizer application requires rapid frequency switching and short settling times, wide bandwidth operation is desirable with minimum phase noise. This is especially true where clock signals are to be extracted from the arithmetic synthesizer. In general, the phase noise (time jitter), which is related to the frequency purity of the generated signals, is on the order of ±½ clock period. The accumulation of timing errors over a given period of operation is equal to the time period multiplied by the short term stability of the internal oscillator (clock). For example, if the short term stability of the oscillator is $10^{-6}$, the cumulative error in the clock over one second is equal to one microsecond. When used in ranging systems, this results in a range error of 500 feet.

Detailed operation of arithmetic synthesizers can be found in U.S. Pat. Nos. 4,021,757; 3,973,209; and 3,689,914, all of which are assigned to the same assignee as the present application.

In a circuit embodying the invention, an arithmetic synthesizer includes a means for supplying digital signals representing frequency numbers, a clock, an accumulator for periodically accumulating the digital signals representing the frequency number to produce digital sum signals having a given modulus, and digital-to-analog conversion means for converting the digital sum signals into analog signals representing the digital sum signals. There is provided an output means responsive to the analog signals for producing an output signal representing the instantaneous value of the average slope of the digital signals.

Figure 1:
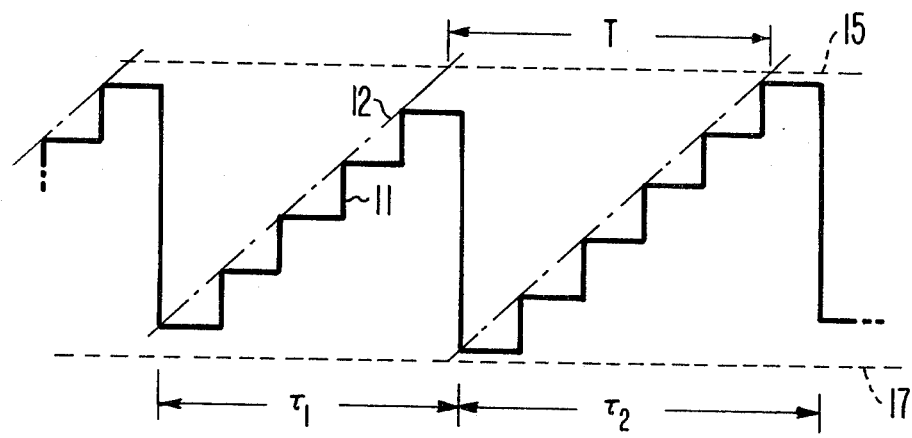
FIG. 1 is an illustration of the wave shape referred to in the following description.
Figure 2:
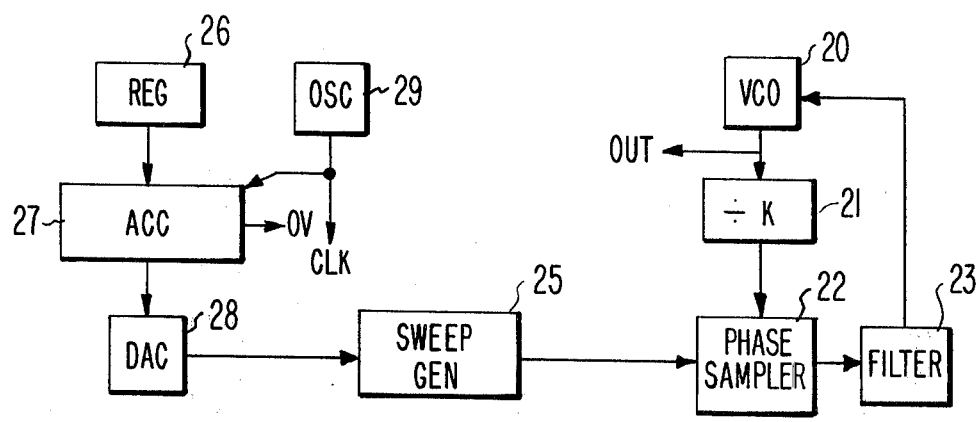
FIG. 2 is a block diagram of a phase-locked loop using an arithmetic synthesizer output as the reference signal and employing the invention.

In FIG. 1, the stepped waveform 11 (solid line) is the output signal from an arithmetic synthesizer's digital-to-analog converter (28, FIG. 2). The slope of such stepped waveforms is either zero or infinity but an average slope can be referred to as a line connecting the same point in each successive step; such points could be the corners of the step, the center of the steps, or the like. The average slope 12 (dot-dash line) of the stepped waveform 11 is shown as taken through the outer corner of each step.

The dotted lines 15 and 17 represent the maximum accumulator capacity and the zero reference points, respectively. The maximum capacity of the accumulator in the arithmetic synthesizer is determined by its number of stages (bits). A 32-bit accumulator, for example, would have a maximum value of $2^{32}$ (= 4,294,967,295). The width of the steps depends on the period of the internal clock of the arithmetic synthesizer. The height of the steps is the value in the frequency register (26, FIG. 2) (frequency number) of the arithmetic synthesizer that is periodically accumulated in the accumulator (27, FIG. 2). The frequency number determines the output frequency from the arithmetic synthesizer according to the following equation:

$$f_o = f_c N_f / N_c$$

where
 $f_o$ = output frequency,
 $f_c$ = clock frequency,
 $N_f$ = frequency number, and
 $N_c$ = accumulator capacity.

The details of the operation of such an arithmetic synthesizer are described in the above-identified U.S. Pat. No. 3,689,914. For purpose of this description, it is sufficient to note that when the capacity of the accumulator is exceeded, an overflow condition results and the accumulator contents decrease to a value equal to the amount by which the last addition of the frequency number caused the accumulator to exceed its capacity. The frequency number is not related to the accumulator capacity so, from cycle to cycle, the values of the steps as well as the high and low values in the accumulator are not necessarily the same for the same frequency number.

If a clock signal is extracted from the arithmetic synthesizer using the overflow signal (carry out), then the time between such extracted clock signals may not be constant. This results in time jitter, phase noise, and frequency impurities. For example, in FIG. 1, the time period $\tau_1$ between two successive overflows is different from $\tau_2$, the time period between the two next successive overflows, by one period of the internal arithmetic synthesizer clock. The average slope lines 12 of the stepped wave 11, however, remain evenly spaced by a time period equal to the actual period of the output signal. The rigorous proof of this can be derived by noting that the ratio of the horizontal distance from the outer corner of the top step to the intersection of the average slope line 12 with the reference line 15 divided by the step width is equal to the ratio of the vertical distance from the top of the top step to the reference line 15 divided by the step height. Therefore, if a ramp voltage is generated equal to the average slope of the output signal from the arithmetic synthesizer and compared to a reference voltage ($V_{REF}$), an output clock signal with low phase noise can be extracted. The value of the reference voltage can be any value between zero and the maximum accumulator capacity. The ramp or sweep generator must be reset to zero when the maximum accumulator capacity is, or would be, reached. Therefore, a single comparator can be used to produce the clock signal and the reset signal for the ramp generator.

FIG. 2 illustrates a phase-locked loop including a voltage controlled oscillator (VCO) 20, a divider 21, a phase sampler or comparator 22, and a loop filter 23. The reference signal to the phase sampler 22 is supplied from a sweep generator 25 embodying the invention. The sweep generator 25 is controlled by the output signal from the arithmetic synthesizer which includes a frequency number register 26, an accumulator 27, a digital-to-analog converter 28, and an oscillator 29 which supplies the internal clock. The output signal from the sweep generator 25 can be a ramp signal corresponding to the average slope of the arithmetic synthesizer output signal or a clock signal derived from such a ramp signal. The phase sampler 22 can be constructed to accommodate either type of input by one of ordinary skill in the art. The simpler type is to use a derived clock signal. A circuit such as shown in FIG. 2 combines the accuracies of a phase-locked loop and of an arithmetic synthesizer. Using the invention, the reference input signal to the phase sampler 22 has no time jitter and consequently, the VCO (20, FIG. 2) produces signals having high spectral purity.

Figure 3:
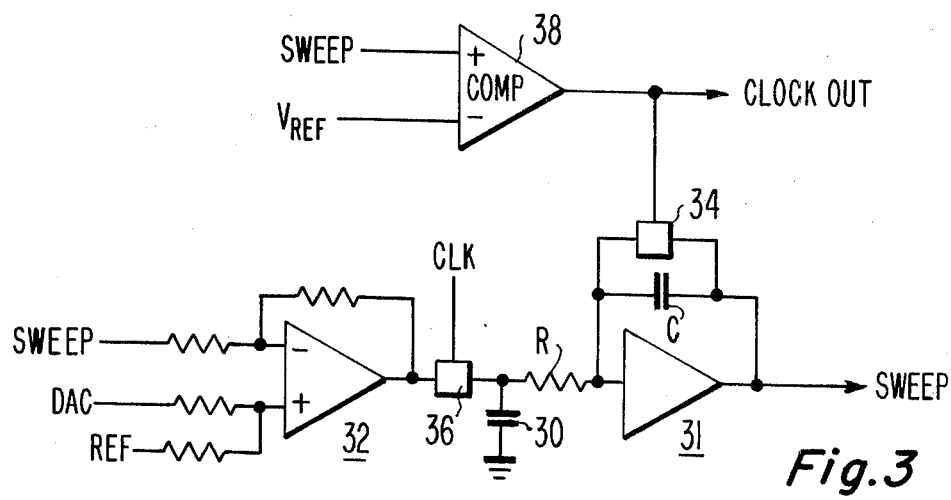
FIG. 3 is a schematic showing of an example of a sweep generator circuit according to the invention.

A circuit performing the function of the sweep generator 25 is shown in detail in FIG. 3. A standard analog integrator 31 produces a ramp or sweep output signal having a slope that is inversely proportional to the RC product and directly proportional to the input voltage. A feedback-coupled amplifier 32 mixes or combines the sweep output signal with the analog signal (stepped waveform 11, FIG. 1) from the digital-to-analog converter 28 (FIG. 2) to produce a difference voltage. A transmission gate 36 couples the difference voltage to a holding capacitor 30 during a clock pulse to provide the input signal to the integrator 31. The sweep output signal from the integrator 31 can be compared against the reference voltage, $V_{REF}$, by comparator 38 from which the derived output clock signal can be taken. The output signal from the comparator 38 is used to activate a transmission gate 34 to discharge the feedback capacitor of the integrator 31, thus resetting this sweep output to a known value.

Figure 4:
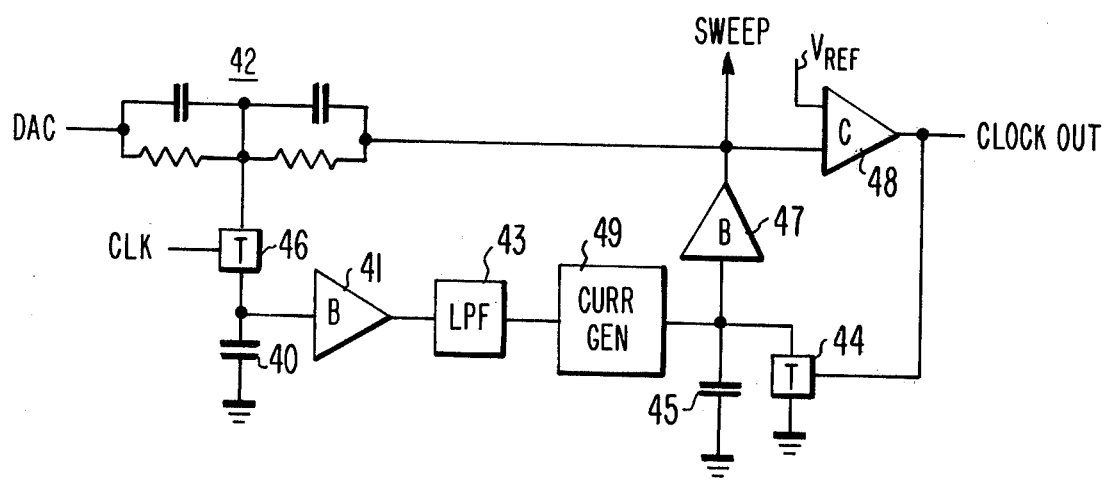
FIG. 4 is an illustration of another embodiment of the sweep generator according to the invention.

Another embodiment of the sweep generator 25 (FIG. 2) is shown in FIG. 4. A resistor-type mixer 42 combines the sweep output signal with the output signal from the arithmetic synthesizer. This signal is coupled to a holding capacitor 40 through a transmission gate 46 in response to a clock signal from the arithmetic synthesizer. A buffer amplifier 41 transfers this voltage to a low pass filter 43 and provides a high input impedance to prevent loading the holding capacitor 40. The filtered voltage is applied to a current generator 49 which produces a constant current, at a value related to its input voltage, to a capacitor 45 producing a linear ramp signal thereon proportional to the output voltage from the mixer 42. A buffer amplifier 47 having a high input impedance is used to produce the sweep voltage without loading the capacitor 45. When the sweep voltage is equal to the reference voltage, $V_{REF}$, the output signal from a comparator 48 produces a derived clock and activates a transmission gate 44 to discharge the capacitor 45 to ground.

The circuits of FIGS. 3 and 4 have been shown to produce an output signal equal to the average slope of the output signal from an arithmetic synthesizer, producing a timing signal without phase noise time jitter and at an accurate frequency.

What is claimed is:

1. In an arithmetic synthesizer including means for supplying digital signals representing a frequency number, means for supplying clock signals, accumulator means for periodically accumulating said digital signals representing a frequency number to produce digital sum signals having a given modulus, and digital-to-analog conversion means receptive of said digital sum signals for producing analog signals representative of said digital sum signals, the improvement comprising:

output means responsive to said analog signals for producing output signals representing the instantaneous value of the average slope of said digital signals;

said output means including means for mixing said output signals and said digital signals to produce difference signals; and said output means further including sweep generator means responsive to said difference signals for producing said output signals having a linear slope determined by the value of said difference signals.

2. The invention as claimed in claim 1 wherein said sweep generator means includes:

current generating means responsive to said difference signals for supplying a current determined by the value of said difference signals; and capacitor means coupled to receive said current for producing said output signals.

3. The invention as claimed in claim 2 wherein said current generating means includes integrator means.

4. The invention as claimed in claim 2 further including holding means responsive to said clock signals for storing the value of said difference signals between successive clock signals.

5. The invention as claimed in claim 4 including:

means for producing a reference signal related to a maximum value of said output signals;

means for comparing said output signals to said reference signal for producing a discharge signal when said output signals are not less than said reference signal; and means coupled across said capacitor means for discharging said output signal in response to said discharge signals.

* * * * *